(12) United States Patent
Loopik et al.

(10) Patent No.: US 12,259,414 B2
(45) Date of Patent: Mar. 25, 2025

(54) SYNCHRONIZATION MECHANISM FOR CONTINOUS BATTERY STACK MEASUREMENTS

(71) Applicant: Analog Devices International Unlimited Company, Limerick (IE)

(72) Inventors: Leon Alexander Loopik, Delft (NL); Christoph Sebastian Schwoerer, Grasbrunn (DE); Cuyler Nicholas Latorraca, Milpitas, CA (US); Gerd Trampitsch, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 470 days.

(21) Appl. No.: 17/820,757

(22) Filed: Aug. 18, 2022

(65) Prior Publication Data

US 2024/0061027 A1 Feb. 22, 2024

(51) Int. Cl.
*G01R 19/25* (2006.01)
(52) U.S. Cl.
CPC .................................. *G01R 19/2513* (2013.01)
(58) Field of Classification Search
CPC .............. G01R 19/2513; G01R 31/396; G01R 19/2503; G01R 19/2509; G01R 31/392; G06F 1/12; H01M 8/04992
See application file for complete search history.

(56) References Cited

U.S. PATENT DOCUMENTS

| 9,270,133 B2 | 2/2016 | Brisebois |
| 10,365,332 B2 | 7/2019 | Gorbold |
| 2015/0104673 A1 | 4/2015 | de Greef et al. |
| 2023/0400522 A1* | 12/2023 | Ogue .................. H01M 10/482 |
| 2024/0027533 A1* | 1/2024 | Loopik ................ G01R 31/389 |

FOREIGN PATENT DOCUMENTS

| CN | 100360336 C | * | 1/2008 | ............. G04G 15/00 |
| CN | 102655337 B | * | 12/2014 | ............. B60L 58/20 |
| DE | 102023120751 A1 | * | 2/2024 | ......... G01R 19/2513 |

* cited by examiner

*Primary Examiner* — Mi'Schita' Henson
(74) *Attorney, Agent, or Firm* — Schwegman Lundberg & Woessner, P.A.

(57) ABSTRACT

Techniques are described through which continuous gapless voltage measurements can be synchronized between devices with independent clock sources on an asynchronous bus by slightly adjusting a speed of a local clock source for a period of time. Also, a read-out technique is described through which the synchronous measurements can be read out in a coherent way. These techniques can allow a high-accuracy time-average of the battery cell voltage (or fuel cell voltage) to be reconstructed, while allowing the same results to be synchronous across an entire battery stack, for use in instantaneous voltage/current diagnostics or calculations.

20 Claims, 5 Drawing Sheets

| Conversion State | Near Edge Bit (Output) | SNAP which result |
|---|---|---|
| < 25% done | 1 | Previous |
| > 25%, < 75% done | 0 | Previous |
| > 75% done | 1 | Current |

| Conversion State | Near_Edge Bit (Input) | SNAP which result |
|---|---|---|
| < 50% done | 0 | Previous |
| > 50% done | 0 | Previous |
| < 50% done | 1 | Previous |
| > 50% done | 1 | Current |

700 ⟶

702 ⟶
Receive a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit 704 ⟶
Intermittently receive, by designated first one of the energy storage device monitoring circuits, a second signal 706 ⟶
For the second energy storage device monitoring circuit: determine a difference between the information representing the counter of the designated first one of the energy storage device monitoring circuits and information representing the counter of the second energy storage device monitoring circuit 708 ⟶
For the second energy storage device monitoring circuit: in response to the determined difference, adjust the local clock source in the second energy storage device monitoring circuit

FIG. 7

SYNCHRONIZATION MECHANISM FOR CONTINOUS BATTERY STACK MEASUREMENTS

FIELD OF THE DISCLOSURE

This document pertains generally, but not by way of limitation, to techniques for monitoring connected energy storage cells.

BACKGROUND

Management of an energy storage system, such as an electric battery or a fuel cell, is essential to ensuring long life, efficiency, and reliability of the energy storage system and an equipment powered by the energy storage system. Proper management requires real time knowledge of cell voltage, e.g., voltage at each energy storage cell should be permanently monitored. Energy storage systems include multiple energy storage cells, e.g., connected or "stacked" in series, so that individual cells near the top of the "stack" may be at elevated voltages with respect to the system ground.

SUMMARY OF THE DISCLOSURE

This disclosure describes, among other things, techniques through which continuous gapless voltage measurements can be synchronized between devices with independent clock sources on an asynchronous bus by slightly adjusting a speed of a local clock source for a period of time. Further, this disclosure describes a read-out technique through which the synchronous measurements can be read out in a coherent way. These techniques can allow a high-accuracy time-average of the battery cell voltage (or fuel cell voltage) to be reconstructed, while allowing the same results to be synchronous across an entire battery stack, for use in instantaneous voltage/current diagnostics or calculations.

In some aspects, this disclosure is directed to an energy storage device monitoring system for adjusting a timing of measurements of a plurality of energy storage devices. The system comprises a plurality of energy storage device monitoring circuits configured to receive a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit; a designated first one of the energy storage device monitoring circuits configured to: intermittently receive a second signal; and modify the second signal to include information representing the counter of the designated first one of the energy storage device monitoring circuits; and transmit the modified second signal to a second energy storage device monitoring circuit. The second energy storage device monitoring circuit is configured to: determine a difference between the information representing the counter of the designated first one of the energy storage device monitoring circuits and information representing the counter of the second energy storage device monitoring circuit; and in response to the determined difference, adjust the local clock source in the second energy storage device monitoring circuit.

In some aspects, this disclosure is directed to a method of adjusting a timing of measurements between a plurality of energy storage device monitoring circuits that are configured to monitor a plurality of energy storage devices, wherein the energy storage device monitoring circuits are configured to be coupled together using an asynchronous communication system. The method comprises receiving a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit; and intermittently receiving, by a designated first one of the energy storage device monitoring circuits, a second signal; modifying, by the designated first one of the energy storage device monitoring circuits, the second signal to include information representing the counter of the designated first one of the energy storage device monitoring circuits and transmitting the modified second signal to a second energy storage device monitoring circuit. In addition, the method comprises for the second energy storage device monitoring circuit: determining a difference between the information representing the counter of the designated first one of the energy storage device monitoring circuits and information representing the counter of the second energy storage device monitoring circuit; and in response to the determined difference, adjusting the local clock source in the second energy storage device monitoring circuit.

In some aspects, this disclosure is directed to a method of adjusting a timing of measurements between a plurality of energy storage device monitoring circuits that are configured to monitor a plurality of energy storage devices, wherein the energy storage device monitoring circuits are configured to be coupled together using an asynchronous communication system, the method comprising: receiving a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit; intermittently receiving a second signal that causes corresponding ones of the energy storage device monitoring circuits to store information representing their corresponding counter. The method further comprising, for a second energy storage device monitoring circuit: determining a difference between the information representing the counter of a designated first one of the energy storage device monitoring circuits and information representing the counter of the second energy storage device monitoring circuit; and in response to the determined difference, adjusting the local clock source in the second energy storage device monitoring circuit.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 7 is a flow diagram of an example of a method of adjusting a timing of measurements between a plurality of energy storage device monitoring circuits that are configured to monitor a plurality of energy storage devices, where the energy storage device monitoring circuits are configured to be coupled together using an asynchronous communication system and where the SYNC command is not padded with empty data, in accordance with this disclosure.

DETAILED DESCRIPTION

Automotive battery monitoring systems (BMS) are used to keep track of state of charge (SOC) and state of health (SOH) of the large battery cell stacks used in electric vehicles. They are also used to balance the cells while charging to maximize their lifetime and total energy stored. BMS ICs generally operate by measuring each of the cell voltages and partially bypassing each cell if so required.

These automotive battery voltages are noisy in nature, due to the varying load current while driving. In order to still determine the battery cell voltage with high accuracy, sufficient suppression of this high frequency noise is required. In order to keep component cost low, it can be desirable to work with high frequency analog anti-aliasing filters in combination with an oversampling ADC. This methodology assures accurate low frequency measurements, while rejecting high-frequency signals. Additionally, accurate reconstruction of the DC cell voltage require ADC measurements to be taken continuously and without significant gaps between the conversions.

Although the DC cell voltage is an important metric, it is also useful to observe and compare the instantaneous voltages of the cells. When the instantaneous cell measurements are well synchronized it will improve battery condition (SOH) diagnostics, battery system safety assessments and battery load control. Maintaining synchronized cell measurements is not straight forward to do in a system with independent continuously sampling cell monitors driven from independent clock sources. In time, the clock sources will not stay completely in sync, such as closer than one analog-to-digital conversion cycle, and the measurements in the battery stack will drift apart.

Additionally, even if the measurements stay reasonably aligned, if there is any (however small) skew between the measurements, it is possible that a read-out command will fall in the timeslot where one measurement is just finished, and the other has just begun, thus creating a skew in the result of 1× the conversion time of the ADC.

This disclosure describes techniques through which continuous gapless voltage measurements can be synchronized between devices with independent clock sources on an asynchronous bus by slightly adjusting a speed of a local clock source for a period of time. Further, this disclosure describes a read-out technique through which the synchronous measurements can be read out in a coherent way.

These techniques can allow a high-accuracy time-average of the battery cell voltage (or fuel cell voltage) to be reconstructed, while allowing the same results to be synchronous across an entire battery stack, for use in instantaneous voltage/current diagnostics or calculations.

A benefit of these techniques is that they do not require a synchronous bus or other system in which a single clock is shared among different devices, while still synchronizing measurements and allowing an accurate time-average signal to be reconstructed.

Figure 1:
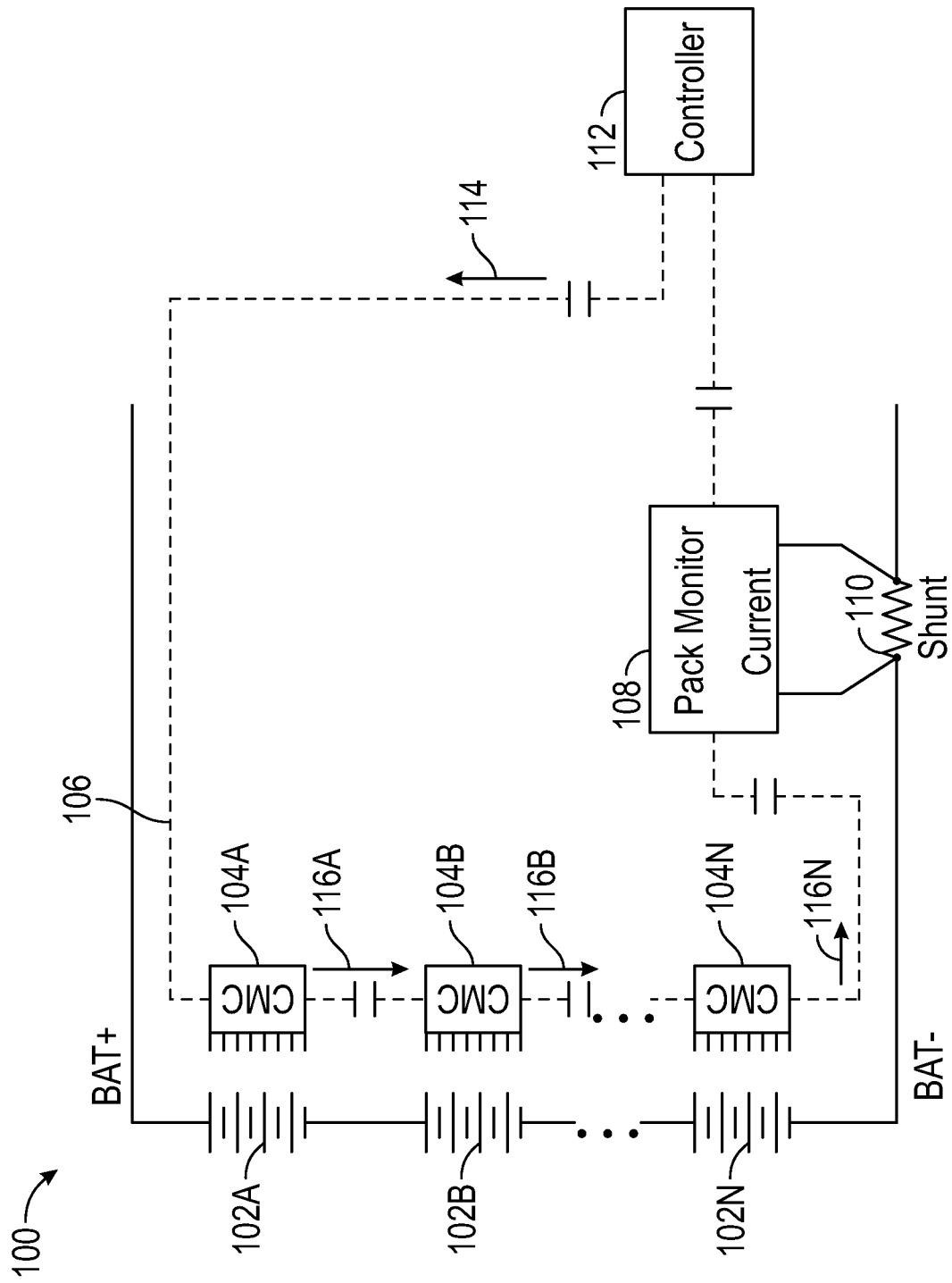
FIG. 1 is a simplified schematic diagram of an example of an energy storage device monitoring system configured to implement various techniques of this disclosure.

FIG. 1 is a simplified schematic diagram of an example of an energy storage device monitoring system 100 configured to implement various techniques of this disclosure. The energy storage device monitoring system 100 of FIG. 1 includes a plurality of energy storage devices 102A-102N, such as coupled together in series. Each energy storage device 102A-102N can include one or more battery cells (or one or more fuel cells, as described below), such as 16 or 18 battery cells.

The energy storage device monitoring system 100 includes a plurality of energy storage device monitoring circuits 104A-104N, such as a plurality of battery cell monitoring circuits (CMC). The energy storage device monitoring circuits 104A-104N can be examples of BMS ICs.

The plurality of energy storage device monitoring circuits 104A-104N are configured to monitor corresponding ones of the plurality of energy storage devices 102A-102N, such as by performing multiple continuous analog-to-digital conversions with little or no gap between the conversions. The plurality of energy storage device monitoring circuits 104A-104N are configured to be coupled together using an asynchronous communication system, such as in a parallel bus configuration or daisy chain configuration.

In the example shown in FIG. 1, the plurality of energy storage device monitoring circuits 104A-104N are capacitively coupled together (due to level shifting) via a two-wire bus 106. In some examples, the plurality of energy storage device monitoring circuits 104A-104N can be coupled together using transformers rather than capacitive coupling.

In some examples, a pack monitoring circuit 108 monitors a current of the plurality of energy storage devices 102A-102N, such as by monitoring a voltage across a sense resistor 110. Alternatively, the current can be measured inductively or magnetically, for example. The pack monitoring circuit 108 is coupled to a controller 112.

The controller 112 can generate and transmit various signals 114 to one or more of the energy storage device monitoring circuits 104A-104N. Individual ones of the energy storage device monitoring circuits 104A-104N can generate and transmit corresponding signals 116A-116N.

Figures 2, 3, 4:
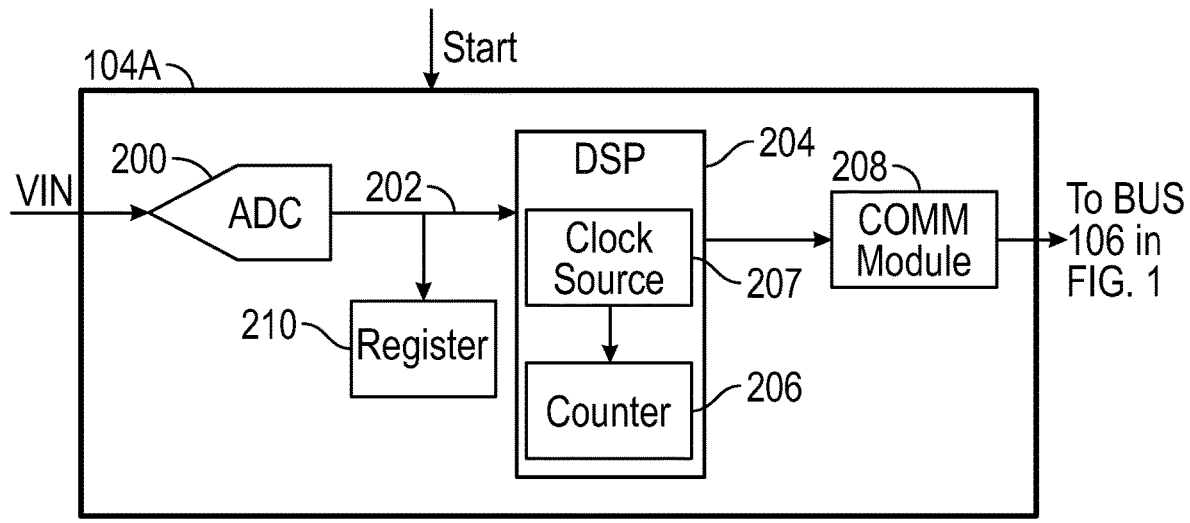
FIG. 2 is an example of an energy storage device monitoring circuit of FIG. 1.
FIG. 3 is a table depicting conversion states and a result to store in a data register corresponding those conversion states for the timing master.
FIG. 4 is a table depicting conversion states and a result to store in a data register corresponding those conversion states for the energy storage devices on the bus other than the timing master.

FIG. 2 is an example of an energy storage device monitoring circuit of FIG. 1. The energy storage device monitoring circuit 104A in FIG. 2 includes an analog-to-digital converter 200 configured to receive a voltage VIN of at least one of the plurality of energy storage devices 102A and converts the voltage VIN to a digital signal 202 representing the voltage VIN.

The energy storage device monitoring circuit 104A in FIG. 2 further includes a digital signal processor (DSP) 204 configured to receive the digital signal 202. The DSP 204 includes a counter 206 that represents a local clock source 207, e.g., an oscillator, of the energy storage device monitoring circuit 104A. The energy storage device monitoring circuit 104A in FIG. 2 includes a communication module 208 configured allow communication over the bus 106 in FIG. 1. The energy storage device monitoring circuit 104A in FIG. 2 includes a data register 210 to store the conversion results of the ADC 200.

The controller 112 of FIG. 1 sends a START command to the bus 106, which causes all energy storage device monitoring circuits on the bus 106 to start continuous conversions and start an internal counter. In other words, the energy storage device monitoring circuit 104A in FIG. 2 receives a first signal, e.g., the START command that, in corresponding ones of the energy storage device monitoring circuits, initiates 1) an analog-to-digital conversion that represents a voltage of at least one of the plurality of energy storage devices, and 2) a counter that represents a local clock source of the corresponding energy storage device monitoring circuit.

In some examples, the controller 112 is the only device on the bus 106 that can initiate a message. It can send data to other devices or a read command. A timing master is selected (or designated). In some examples, the timing master can be selected because it is the first device in the chain, such as the energy storage device monitoring circuit 104A in FIG. 1. The controller 112 can select the device or the device to be selected can be embedded in the protocol that is run. In some examples, the controller 112 can be the timing master.

The controller 112 can intermittently, e.g., every 10 ms or 100 ms (Tsync), transmit a SYNC command signal to the other devices on the bus 106. In this manner, a designated first one of the energy storage device monitoring circuits can intermittently receive a second signal, e.g., a SYNC command signal. In some examples, the SYNC command is padded with empty data.

In some examples, the designated first one of the energy storage device monitoring circuits, such as the energy storage device monitoring circuit 104A in FIG. 1, modifies the SYNC command signal, such as by the DSP 204, to include information representing the counter 206 of the designated first one of the energy storage device monitoring circuits. In other words, the timing master modifies the empty data to reflect its counter value. Then, using its communication module 208, the designated first one of the energy storage device monitoring circuits transmits the modified SYNC command signal to a second energy storage device monitoring circuit.

All other devices in the chain read out the timing master's counter value and calculate the difference between their own counter value and the timing master's counter value. Based on the counter value, each device decides if it needs to temporarily speed up or slow down its internal clock source, and for what amount of time, to get back in sync with the timing master.

For example, the second energy storage device monitoring circuit, such as the energy storage device monitoring circuit 104B in FIG. 1, determines a difference between the information representing the counter of the designated first one of the energy storage device monitoring circuits and information representing the counter of the second energy storage device monitoring circuit. For example, the DSP 204 can determine the difference. In response to the determined difference, the second energy storage device monitoring circuit adjusts its local clock source. For example, the second energy storage device monitoring circuit can adjust a speed of its local clock source for a number of clock cycles.

By way of a non-limiting example, the first energy storage device monitoring circuit 104A sends its count to the second energy storage device monitoring circuit 104B. The counter of the first energy storage device monitoring circuit 104A was 10000 and the counter of the second energy storage device monitoring circuit 104B was 10050, so the second one is 50 too fast in the elapsed period. The second energy storage device monitoring circuit 104B should run slower for some amount of time to get closer to the same count. This process can be performed intermittently or periodically. In this manner, the techniques of this disclosure adjust a timing of measurements between a plurality of energy storage device monitoring circuits that are configured to monitor a plurality of energy storage devices.

By way of a non-limiting example, the first energy storage monitoring circuit 104A has a counter at 10000 and the second energy storage monitoring circuit 104B has a counter at 10050. The second energy storage monitoring circuit 104B is 50 counts too fast within the elapsed time, so it should run slower for some amount of time to get it closer to the same count. For example, the local clock source of the second energy storage monitoring circuit 104B can slow down by 10% for 450 clock cycles so that the other ICs run 500 within the time frame.

The modified SYNC command signal is transmitted over the bus 106 to a third energy storage device monitoring circuit. The third energy storage device monitoring circuit can determine a difference between the information representing the counter of the designated first one of the energy storage device monitoring circuits and information representing the counter of the third energy storage device monitoring circuit. In some examples, the determined different can be multiplied by a constant, which represents the amount by which to speed up or slow down so that the devices sync up with one another. In response to the determined difference, the third energy storage device monitoring circuit can adjust the local clock source in the third battery cell monitoring circuit. This process can continue such that the local clock sources of the energy storage device monitoring circuits 104B-104N are adjusted. This process can be performed intermittently so that the energy storage device monitoring circuits 104A-104N stay in sync with one another.

In some examples, all the counters 206 in the system are decreased by the master device's counter value, which can prevent the counters 206 from overflowing in long running measurements. As an example, the value of the counter 206 of the second battery cell monitoring circuit can be decreased by the value of the counter 206 of the designated first one of the battery cell monitoring circuits. In other examples, all the counters 206 can be reset by the controller 112 such as in response to receiving a SYNC command signal.

In some examples, whenever the SYNC command signal is transmitted, all energy storage device monitoring circuits 104A-104N on the bus freeze their respective counters at the same time, such as using an agreed edge, such as the last clock edge of the SYNC command. The goal here is to let the controller 112 read and re-distribute the "master" count value.

The techniques described above can adjust a timing of measurements between a plurality of energy storage device monitoring circuits that are configured to monitor a plurality of energy storage devices. To improve synchronization even more between the energy storage device monitoring circuits, an integration term can be used.

For example, the DSP 204 of the second energy storage device monitoring circuit 104B can integrate the determined difference between the information representing the counter of the designated first the energy storage device monitoring circuit 104A and information representing the counter of the second energy storage device monitoring circuit 104B to generate an integrated compensation term. Then, the second energy storage device monitoring circuit 104B can adjust its local clock source using the integrated compensation term. That is, every time an energy storage device monitoring circuit receives a SYNC command signal, and the energy storage device monitoring circuit is not still counting down from the last SYNC command signal, the DSP can determine a relative increase or decrease from the timing master, and the DSP can integrate a portion of this, which can be used to adjust a local clock source. In this manner, an integrated compensation term is determined over time and can be used to improve the synchronization.

For example, the clock can be increased indefinitely by a small percentage of the accumulated error. Ideally, the additional error will go to zero over time, so the integrated error will remain at a fixed value. In reality and depending on circumstances, the additional error can vary between positive and negative with decreasing amplitude, or slowly move to zero from one side (positive or negative). But the overall effect is the same, the integrated value will be stable after a while.

In the non-limiting example described above without integration, the second energy storage monitoring circuit 104B is 50 counts too fast within the elapsed time. Using integration, the 50 counts can be stored in a separate variable. The next time that the counters between the first energy storage monitoring circuit 104A and the second energy storage monitoring circuit 104B are compared, if the second energy storage monitoring circuit 104B is 30 counts behind, for example, the 30 counts can be added to the 50 counts previous stored. Then, the local clock source of the second energy storage monitoring circuit 104B can be increased by some percentage for some number of clock cycles.

The controller 112 can use the techniques described above to synchronize the energy storage device monitoring circuits. When the controller 112 wants to read out a conversion from the energy storage device monitoring circuits to determine a voltage of an associated plurality of energy storage devices, an ADC 200 of one energy storage device monitoring circuit may have just finished performing a conversion while an ADC 200 of another energy storage device monitoring circuit may have just started a conversion. As such, there is a gap between the two conversions.

To solve this problem, the present inventors have recognized that the controller 112 can transmit a third signal, e.g., a SYNCSNAP command signal, over the bus 106 before performing a read out. In some examples, the SYNCSNAP command signal is padded with empty data. The designated first one of the energy storage monitoring circuits, e.g., the energy storage monitoring circuits 104A, can receive the SYNCSNAP command signal. The designated first one of the energy storage monitoring circuits can modify the SYNCSNAP command signal to include information representing a state of the analog-to-digital conversion and transmit the modified third signal to the second energy storage monitoring circuits, e.g., energy storage monitoring circuits 104B.

The second energy storage monitoring circuit 104B can determine, based on the information representing the state of the analog-to-digital conversion of the first one of the energy storage monitoring circuits, whether to store a previous analog-to-digital conversion or a current analog-to-digital conversion in a data register. Then, the second energy storage monitoring circuit 104B can store the determined analog-to-digital conversion in the data register.

In other words, the timing master modifies the empty data in the SYNCSNAP command signal to reflect if the ADC 200 of the timing master is close to finishing a conversion or just started a conversion, and the rest of the energy storage monitoring circuits receive this information. Based on the SYNCSNAP command signal, the energy storage monitoring circuits on the bus 106 of FIG. 1 determine which conversion result (previous conversion or current conversion) to snap in their data registers. FIGS. 3 and 4 depict conversion states and a result to store in a data register corresponding those conversion states.

FIG. 3 is a table 300 depicting conversion states and a result to store in a data register corresponding those conversion states for the timing master. The table 300 includes 3 columns: left column 302, middle column 304, and right column 306. In the left column 302, conversion states of an ADC 200 of the timing master energy storage monitoring circuit, such as the energy storage monitoring circuit 104A of FIG. 1, are depicted. The middle column 304 depicts the near edge bit (output). The "near edge" in this case means close to the edge of a conversion: just started or almost finished. If the bit is 0, the ADC is roughly in the middle 50% of a conversion, otherwise the bit is 1. The right column 306 depicts which conversion result to "snap" or store in the data register.

For example, if the conversion state is less than 25% done at the time a SYNCSNAP command is received, then the energy storage monitoring circuit 104A stores the previous conversion result. However, if the conversion state is greater than 75% done at the time a SYNCSNAP command is received, then the energy storage monitoring circuit 104A stores the current conversion result. If the conversion state is greater than 25% done but less than 75% done at the time a SYNCSNAP command is received, then the energy storage monitoring circuit 104A stores the previous conversion result.

FIG. 4 is a table 400 depicting conversion states and a result to store in a data register corresponding those conversion states for the energy storage devices on the bus other than the timing master. The table 400 includes 3 columns: left column 402, middle column 404, and right column 406. In the left column 402, conversion states of an ADC 200 of an energy storage monitoring circuit other than the timing master, such as the energy storage monitoring circuit 104B of FIG. 1, are depicted. The middle column 404 depicts the near edge bit (input). The right column 406 depicts which conversion result to "snap" or store in the data register.

For example, if the conversion state is less than 50% done at the time a SYNCSNAP command signal is received and the near edge bit is 0, then the energy storage monitoring circuit 104B stores the previous conversion result. In addition, if the conversion state is less than 50% done at the time a SYNCSNAP command signal is received and the near edge bit is 1, then the energy storage monitoring circuit 104B stores the previous conversion result. If the conversion state is less than 50% done at the time a SYNCSNAP command signal is received and the near edge bit is 1, then the energy storage monitoring circuit 104B stores the previous conversion result. If the conversion state is greater than 50% done at the time a SYNCSNAP command signal is received and the near edge bit is 1, then the energy storage monitoring circuit 104B stores the current conversion result.

In some examples, after storing the determined analog-to-digital conversion in a data register, the controller 112 locks the data registers of the energy storage monitoring circuits. That is, when the results are stored or "snapped" in the data register via the SYNCSNAP command signal, the data register is locked and will not update until a fourth signal, e.g., an UNSNAP command signal, is received from the controller 112. When the controller 112 transmits an UNSNAP command signal, all data registers are "unsnapped" or unlocked.

As mentioned above, the techniques of this disclosure are not limited to monitoring battery cells and be used to monitor other energy storage devices, such as fuel cells.

Figure 5:
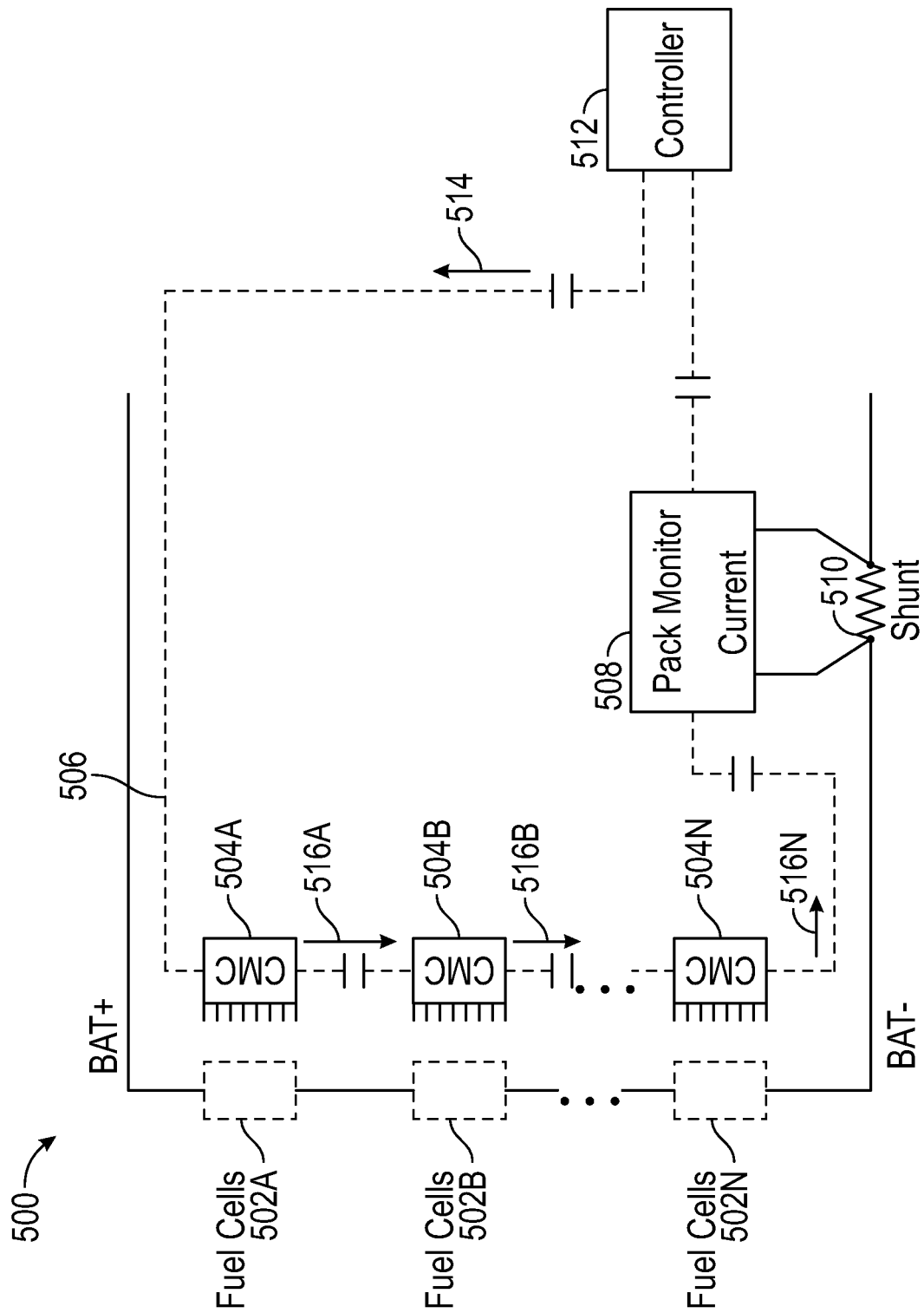
FIG. 5 is a simplified schematic diagram of an example of an energy storage device monitoring system configured to implement various techniques of this disclosure.

FIG. 5 is a simplified schematic diagram of an example of an energy storage device monitoring system 500 configured to implement various techniques of this disclosure. The energy storage device monitoring system 500 of FIG. 5 includes a plurality of energy storage devices 502A-502N, such as coupled together in series. Each energy storage device 502A-502N can include one or more fuel cells.

The energy storage device monitoring system 500 includes a plurality of energy storage device monitoring circuits 504A-504N, such as a plurality of fuel cell monitoring circuits. The plurality of energy storage device monitoring circuits 504A-504N are configured to monitor corresponding ones of the plurality of energy storage devices 502A-502N, such as by performing multiple continuous analog-to-digital conversions with little or no gap between the conversions. The plurality of energy storage device monitoring circuits 504A-504N are configured to be coupled together using an asynchronous communication system, such as in a parallel bus configuration or daisy chain configuration. The energy storage device monitoring circuits 504A-504N can be similar to the energy storage device monitoring circuits 104A-104N, an example of which being shown and described above with respect to FIG. 2.

In the example shown in FIG. 5, the plurality of energy storage device monitoring circuits 504A-504N are capacitively coupled together (due to level shifting) via a two-wire bus 106. In some examples, the plurality of energy storage device monitoring circuits 504A-504N can be coupled together using transformers rather than capacitive coupling.

A pack monitoring circuit 508 monitors a current of the plurality of energy storage devices 502A-502N, such as by monitoring a voltage across a sense resistor 510. The pack monitoring circuit 508 is coupled to a controller 512.

The controller 512 can generate and transmit various signals 514 to one or more of the energy storage device monitoring circuits 504A-504N. Individual ones of the energy storage device monitoring circuits 504A-504N can generate and transmit corresponding signals 516A-516N.

Figure 6:
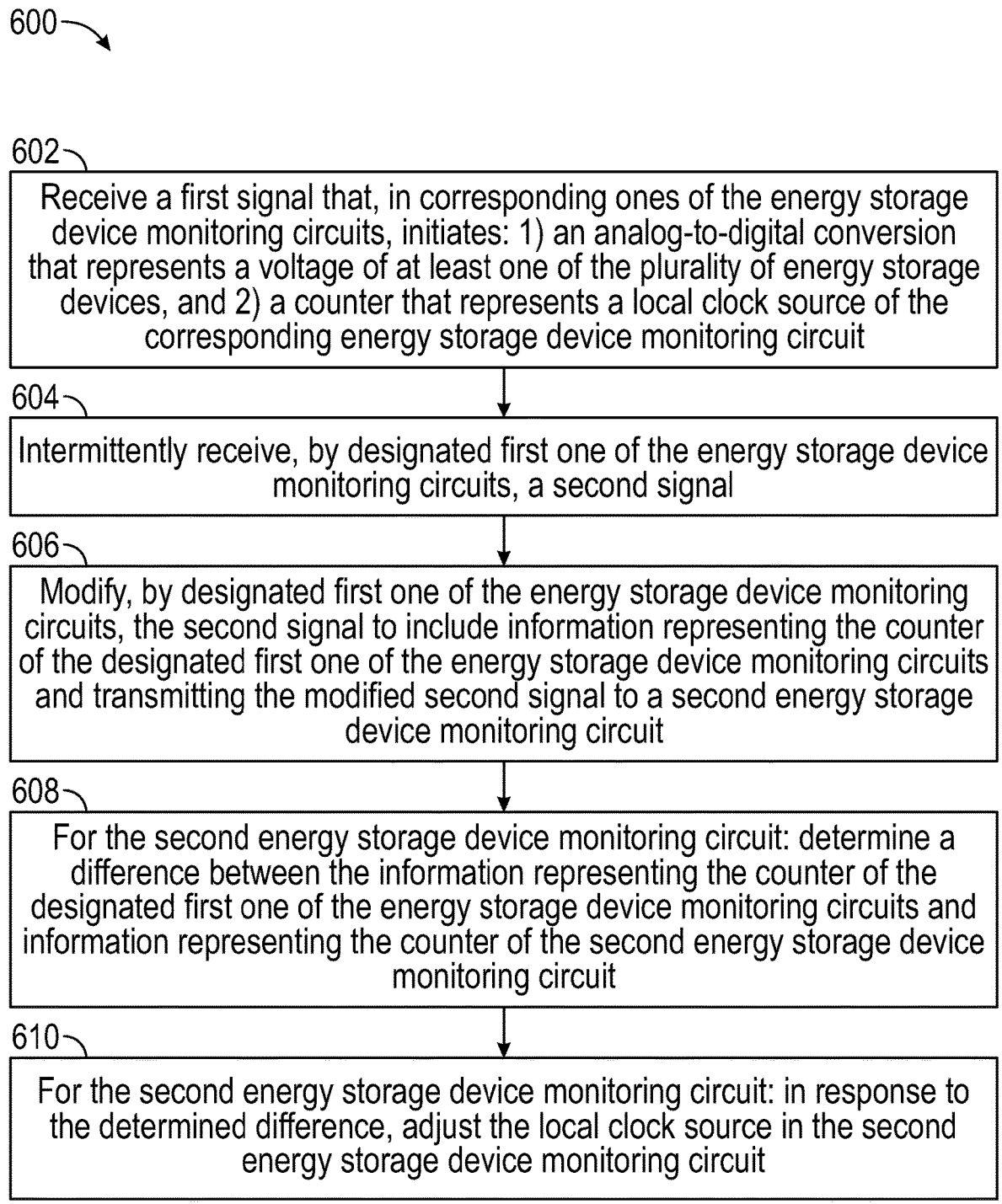
FIG. 6 is a flow diagram of an example of a method of adjusting a timing of measurements between a plurality of energy storage device monitoring circuits that are configured to monitor a plurality of energy storage devices, where the energy storage device monitoring circuits are configured to be coupled together using an asynchronous communication system, in accordance with this disclosure.

FIG. 6 is a flow diagram of an example of a method 600 of adjusting a timing of measurements between a plurality of energy storage device monitoring circuits that are configured to monitor a plurality of energy storage devices, where the energy storage device monitoring circuits are configured to be coupled together using an asynchronous communication system, in accordance with this disclosure.

At block 602, the method 600 includes receiving a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit. For example, the energy storage device monitoring circuit 104A of FIG. 1 can receive a signal 114, e.g., a START command signal, from the controller 112 of FIG. 1 that causes the ADC 200 of FIG. 2 to initiate an analog-to-digital conversion that represents a voltage of the energy storage device 102A, e.g., battery cell(s). The techniques of FIG. 6 are also applicable to the fuel cells of FIG. 5.

At block 604, the method 600 includes intermittently receiving, by a designated first one of the energy storage device monitoring circuits, a second signal. For example, the energy storage device monitoring circuit 104A of FIG. 1 can be the designated energy storage device monitoring circuit and can receive a signal 114, e.g., a SYNC command signal, from the controller 112 of FIG. 1. In some examples, the SYNC command is padded with empty data.

At block 606, the method 600 includes modifying, by the designated first one of the energy storage device monitoring circuits, the second signal to include information representing the counter of the designated first one of the energy storage device monitoring circuits and transmitting the modified second signal to a second energy storage device monitoring circuit. For example, the energy storage device monitoring circuit 104A in FIG. 1 can modify the SYNC command signal, such as by the DSP 204 of FIG. 2, to include information representing the counter 206 of the energy storage device monitoring circuit 104A. Using its communication module 208, the energy storage device monitoring circuit 104A can transmit the modified SYNC command signal to a second energy storage device monitoring circuit, such as the second energy storage monitoring circuit 104B of FIG. 1.

At block 608, the method 600 includes, for the second energy storage device monitoring circuit, determining a difference between the information representing the counter of the designated first one of the energy storage device monitoring circuits and information representing the counter of the second energy storage device monitoring circuit. For example, the second energy storage device monitoring circuit, such as the energy storage device monitoring circuit 104B in FIG. 1, determines a difference between the information representing the counter of the designated first one of the energy storage device monitoring circuits and information representing the counter of the second energy storage device monitoring circuit.

At block 610, the method 600 includes, for the second energy storage device monitoring circuit, in response to the determined difference, adjusting the local clock source in the second energy storage device monitoring circuit. In response to the determined difference, the second energy storage device monitoring circuit 104B of FIG. 1 adjusts its local clock source 207. For example, the second energy storage device monitoring circuit 104B can adjust a speed of its local clock source 207 for a number of clock cycles.

In some examples, the plurality of energy storage device monitoring circuits includes a plurality of battery cell monitoring circuits, and the plurality of energy storage devices includes a plurality of battery cells 102A-102N. In other examples, the plurality of energy storage device monitoring circuits includes a plurality of fuel cell monitoring circuits 504A-504N of FIG. 5, and the plurality of energy storage devices includes a plurality of fuel cells 502A-502N of FIG. 5.

In some examples, adjusting the local clock source in the second energy storage device monitoring circuit includes adjusting a speed of the local clock source in the second energy storage device monitoring circuit for a number of clock cycles.

In some examples, the method 600 includes integrating the determined difference to generate an integrated compensation term, and adjusting the local clock source in the second energy storage device monitoring circuit includes adjusting the local clock source in the second energy storage device monitoring circuit using the integrated compensation term.

In some examples, the method 600 includes decreasing the counter of the second energy storage device monitoring circuit by the counter of the designated first one of the energy storage device monitoring circuits.

In some examples, the method 600 includes receiving, by the designated first one of the energy storage device monitoring circuits, a third signal, e.g., a SYNCSNAP command signal. The method 600 can include modifying, by the designated first one of the energy storage device monitoring circuits, the third signal to include information representing a state of the analog-to-digital conversion and transmitting the modified third signal to the second energy storage device monitoring circuit. The method 600 can include determining, by the second energy storage device monitoring circuit and based on the information representing the state of the analog-to-digital conversion of the first one of the energy storage device monitoring circuits, whether to store a previous analog-to-digital conversion or a current analog-to-digital conversion in a data register. The method 600 can include storing the determined analog-to-digital conversion in the data register.

In some examples, the method 600 includes after storing the determined analog-to-digital conversion in a data register, locking the data register.

In some examples, the method 600 includes receiving, by the second energy storage device monitoring circuit, a fourth signal, e.g., signal 114 of FIG. 1, where the fourth signal unlocks the data register, e.g., an UNSNAP command signal.

In some examples, the method 600 includes transmitting the modified second signal to a third energy storage device monitoring circuit. For the third energy storage device monitoring circuit, method 600 includes determining a difference between the information representing the counter of the designated first one of the energy storage device monitoring circuits and information representing the counter of the third energy storage device monitoring circuit, and in response to the determined difference, adjusting the local clock source in the third energy storage device monitoring circuit.

As mentioned above, in some examples, the SYNC command is padded with empty data and then the SYNC command signal can be modified. In other examples, the SYNC command is not padded with empty data, such as described with respect to FIG. 7. In some such examples, the controller 112 transmits a START command signal to the bus 106. The START command signal causes the energy storage device monitoring circuits 104-104N on the bus 106 to start continuation A/D conversions using their corresponding ADC 200 and start an internal counter using their corresponding counter 206.

One of the energy storage device monitoring circuits 104-104N is selected as a designated first one of the energy storage device monitoring circuits, e.g., a timing master, such as by hardware topology (e.g., first device in daisy chain) or by configuration (e.g., configured device on a parallel bus or in a daisy chain).

Intermittently, such as every time Tsync, the controller 112 can send a SYNC command signal that causes all energy storage device monitoring circuits 104-104N to sample, e.g., store, information representing a value of their corresponding counter 206. The controller 112 can then read out the information representing the value of the counter value of the designated first one of the energy storage device monitoring circuits, e.g., the energy storage device monitoring circuits 104A, and transmit a signal including that information to the other energy storage device monitoring circuits, e.g., the energy storage device monitoring circuits 104B-104N.

These other energy storage device monitoring circuits 104B-104N can then calculate the difference between their own counter value and the timing master's counter value. Based on the counter value, each of these other energy storage device monitoring circuits 104B-104N decides if it needs to temporarily speed up, or slow down its internal clock source 207, and for what amount of time, to get back in sync with the timing master, e.g., the energy storage device monitoring circuits 104A. The energy storage device monitoring circuits 104B-104N increase or decrease their internal clock sources, if needed. Then, in some examples, the counters in the system are decreased by the timing master's counter value to prevent the counters from overflowing in long running measurements. A flow diagram of such an example is shown in FIG. 7.

FIG. 7 is a flow diagram of an example of a method 700 of adjusting a timing of measurements between a plurality of energy storage device monitoring circuits that are configured to monitor a plurality of energy storage devices, where the energy storage device monitoring circuits are configured to be coupled together using an asynchronous communication system and where the SYNC command is not padded with empty data, in accordance with this disclosure.

At block 702, the method 700 includes receiving a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit. For example, the energy storage device monitoring circuit 104A of FIG. 1 can receive a signal 114 from the controller 112 of FIG. 1 that causes the ADC 200 of FIG. 2 to initiate an analog-to-digital conversion that represents a voltage of the energy storage device 102A, e.g., battery cell(s). The techniques of FIG. 6 are also applicable to the fuel cells of FIG. 4.

At block 704, the method 700 includes intermittently receiving a second signal that causes corresponding ones of the energy storage device monitoring circuits to store information representing their corresponding counter. For example, the energy storage device monitoring circuits 104A-104N of FIG. 1 can receive a signal 114, e.g., a SYNC command signal, from the controller 112 of FIG. 1 that that causes corresponding ones of the energy storage device monitoring circuits 104A-104N to store information representing their corresponding counter 206.

At block 706, the method 700 includes, for the second energy storage device monitoring circuit, determining a difference between the information representing the counter of a designated first one of the energy storage device monitoring circuits and information representing the counter of the second energy storage device monitoring circuit. For example, the second energy storage device monitoring circuit, such as the energy storage device monitoring circuit 104B in FIG. 1, determines a difference between the information representing the counter of the designated first one of the energy storage device monitoring circuits and information representing the counter of the second energy storage device monitoring circuit.

At block 708, the method 700 includes, for the second energy storage device monitoring circuit, in response to the determined difference, adjusting the local clock source in the second energy storage device monitoring circuit. In response to the determined difference, the second energy storage device monitoring circuit 104B of FIG. 1 adjusts its local clock source 207. For example, the second energy storage device monitoring circuit 104B can adjust a speed of its local clock source 207 for a number of clock cycles.

In some examples, the plurality of energy storage device monitoring circuits includes a plurality of battery cell monitoring circuits, and the plurality of energy storage devices includes a plurality of battery cells 102A-102N. In other examples, the plurality of energy storage device monitoring circuits includes a plurality of fuel cell monitoring circuits 504A-504N of FIG. 5, and the plurality of energy storage devices includes a plurality of fuel cells 502A-502N of FIG. 5.

In some examples, adjusting the local clock source in the second energy storage device monitoring circuit includes adjusting a speed of the local clock source in the second energy storage device monitoring circuit for a number of clock cycles.

In some examples, the method 700 includes integrating the determined difference to generate an integrated compensation term, and adjusting the local clock source in the second energy storage device monitoring circuit includes adjusting the local clock source in the second energy storage device monitoring circuit using the integrated compensation term.

In some examples, the method 700 includes decreasing the counter of the second energy storage device monitoring circuit by the counter of the designated first one of the energy storage device monitoring circuits.

In some examples, the method 700 includes receiving, by the designated first one of the energy storage device monitoring circuits, a third signal, e.g., a SYNCSNAP command signal. The method 700 can include modifying, by the designated first one of the energy storage device monitoring circuits, the third signal to include information representing a state of the analog-to-digital conversion and transmitting the modified third signal to the second energy storage device monitoring circuit. The method 700 can include determining, by the second energy storage device monitoring circuit and based on the information representing the state of the analog-to-digital conversion of the first one of the energy storage device monitoring circuits, whether to store a previous analog-to-digital conversion or a current analog-to-digital conversion in a data register. The method 700 can include storing the determined analog-to-digital conversion in the data register.

In some examples, the method 700 includes after storing the determined analog-to-digital conversion in a data register, locking the data register.

In some examples, the method 700 includes receiving, by the second energy storage device monitoring circuit, a fourth signal, e.g., signal 114 of FIG. 1, where the fourth signal unlocks the data register, e.g., an UNSNAP command signal.

In some examples, the method 700 includes transmitting the modified second signal to a third energy storage device monitoring circuit. For the third energy storage device monitoring circuit, method 700 includes determining a difference between the information representing the counter of the designated first one of the energy storage device monitoring circuits and information representing the counter of the third energy storage device monitoring circuit, and in response to the determined difference, adjusting the local clock source in the third energy storage device monitoring circuit.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the The claimed invention is:

1. An energy storage device monitoring system for adjusting a timing of measurements of a plurality of energy storage devices, the system comprising:
   a plurality of energy storage device monitoring circuits configured to receive a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit;
   a designated first one of the energy storage device monitoring circuits configured to:
      intermittently receive a second signal; and
      modify the second signal to include information representing the counter of the designated first one of the energy storage device monitoring circuits; and
      transmit the modified second signal to a second energy storage device monitoring circuit; and
   the second energy storage device monitoring circuit configured to:
      determine a difference between the information representing the counter of the designated first one of the energy storage device monitoring circuits and information representing the counter of the second energy storage device monitoring circuit; and
      in response to the determined difference, adjust the local clock source in the second energy storage device monitoring circuit.

2. The system of claim 1, wherein the plurality of energy storage device monitoring circuits include a plurality of battery cell monitoring circuits, wherein the plurality of energy storage devices includes a plurality of battery cells, wherein the designated first one of the energy storage device monitoring circuits includes a designated first one of the battery cell monitoring circuits, and wherein the second energy storage device monitoring circuit includes a second battery monitoring circuit.

3. The system of claim 1, wherein the plurality of energy storage device monitoring circuits includes a plurality of fuel cell monitoring circuits, wherein the plurality of energy storage devices includes a plurality of fuel cells, wherein the designated first one of the energy storage device monitoring circuits includes a designated first one of the fuel cell monitoring circuits, and wherein the second energy storage device monitoring circuit includes a second fuel monitoring circuit.

4. The system of claim 1, wherein the second energy storage device monitoring circuit configured to adjust the local clock source is configured to:
   adjust a speed of the local clock source for a number of clock cycles.

5. The system of claim 1, wherein the second energy storage device monitoring circuit is configured to:
   integrate the determined difference to generate an integrated compensation term, and
   wherein the second energy storage device monitoring circuit configured to adjust the local clock source is configured to:
   adjust the local clock source using the integrated compensation term.

6. The system of claim 1, wherein the designated first one of the energy storage device monitoring circuits is configured to:
   receive a third signal;
   modify the third signal to include information representing a state of the analog-to-digital conversion and transmit the modified third signal to the second energy storage device monitoring circuit; and
   wherein the second energy storage device monitoring circuit is configured to:
   determine, based on the information representing the state of the analog-to-digital conversion of the first one of the energy storage device monitoring circuits, whether to store a previous analog-to-digital conversion or a current analog-to-digital conversion in a data register; and
   store the determined analog-to-digital conversion in the data register.

7. The system of claim 6, wherein the second energy storage device monitoring circuit is configured to:
   after storing the determined analog-to-digital conversion in a data register, lock the data register.

8. The system of claim 7, wherein the second energy storage device monitoring circuit is configured to:
   receive a fourth signal, wherein the fourth signal unlocks the data register.

9. A method of adjusting a timing of measurements between a plurality of energy storage device monitoring circuits that are configured to monitor a plurality of energy storage devices, wherein the energy storage device monitoring circuits are configured to be coupled together using an asynchronous communication system, the method comprising:
   receiving a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit;
   intermittently receiving, by a designated first one of the energy storage device monitoring circuits, a second signal;
   modifying, by the designated first one of the energy storage device monitoring circuits, the second signal to include information representing the counter of the designated first one of the energy storage device monitoring circuits and transmitting the modified second signal to a second energy storage device monitoring circuit;
   for the second energy storage device monitoring circuit:
      determining a difference between the information representing the counter of the designated first one of the energy storage device monitoring circuits and information representing the counter of the second energy storage device monitoring circuit; and in response to the determined difference, adjusting the local clock source in the second energy storage device monitoring circuit.

10. The method of claim 9, wherein the plurality of energy storage device monitoring circuits includes a plurality of battery cell monitoring circuits, wherein the plurality of energy storage devices includes a plurality of battery cells, wherein the designated first one of the energy storage device monitoring circuits includes a designated first one of the battery cell monitoring circuits, and wherein the second energy storage device monitoring circuit includes a second battery monitoring circuit.

11. The method of claim 9, wherein the plurality of energy storage device monitoring circuits includes a plurality of fuel cell monitoring circuits, wherein the plurality of energy storage devices includes a plurality of fuel cells, wherein the designated first one of the energy storage device monitoring circuits includes a designated first one of the fuel cell monitoring circuits, and wherein the second energy storage device monitoring circuit includes a second fuel cell monitoring circuit.

12. The method of claim 9, wherein adjusting the local clock source in the second energy storage device monitoring circuit includes:
adjusting a speed of the local clock source in the second energy storage device monitoring circuit for a number of clock cycles.

13. The method of claim 9, comprising:
integrating the determined difference to generate an integrated compensation term,
wherein adjusting the local clock source in the second energy storage device monitoring circuit includes:
adjusting the local clock source in the second energy storage device monitoring circuit using the integrated compensation term.

14. The method of claim 9, comprising:
decreasing the counter of the second energy storage device monitoring circuit by the counter of the designated first one of the energy storage device monitoring circuits.

15. The method of claim 9, comprising:
receiving, by the designated first one of the energy storage device monitoring circuits, a third signal;
modifying, by the designated first one of the energy storage device monitoring circuits, the third signal to include information representing a state of the analog-to-digital conversion and transmitting the modified third signal to the second energy storage device monitoring circuit;
determining, by the second energy storage device monitoring circuit and based on the information representing the state of the analog-to-digital conversion of the first one of the energy storage device monitoring circuits, whether to store a previous analog-to-digital conversion or a current analog-to-digital conversion in a data register; and
storing the determined analog-to-digital conversion in the data register.

16. The method of claim 15, comprising:
after storing the determined analog-to-digital conversion in a data register, locking the data register.

17. The method of claim 16, comprising:
receiving, by the second energy storage device monitoring circuit, a fourth signal, wherein the fourth signal unlocks the data register.

18. The method of claim 9, comprising:
transmitting the modified second signal to a third energy storage device monitoring circuit; and
for the third energy storage device monitoring circuit:
determining a difference between the information representing the counter of the designated first one of the energy storage device monitoring circuits and information representing the counter of the third energy storage device monitoring circuit; and
in response to the determined difference, adjusting the local clock source in the third energy storage device monitoring circuit.

19. A method of adjusting a timing of measurements between a plurality of energy storage device monitoring circuits that are configured to monitor a plurality of energy storage devices, wherein the energy storage device monitoring circuits are configured to be coupled together using an asynchronous communication system, the method comprising:
receiving a first signal that, in corresponding ones of the energy storage device monitoring circuits, initiates: 1) an analog-to-digital conversion that represents a voltage of at least one of the plurality of energy storage devices, and 2) a counter that represents a local clock source of the corresponding energy storage device monitoring circuit;
intermittently receiving a second signal that causes corresponding ones of the energy storage device monitoring circuits to store information representing their corresponding counter;
for a second energy storage device monitoring circuit:
determining a difference between the information representing the counter of a designated first one of the energy storage device monitoring circuits and information representing the counter of the second energy storage device monitoring circuit; and
in response to the determined difference, adjusting the local clock source in the second energy storage device monitoring circuit.

20. The method of claim 19, comprising:
integrating the determined difference to generate an integrated compensation term,
wherein adjusting the local clock source in the second energy storage device monitoring circuit includes:
adjusting the local clock source in the second energy storage device monitoring circuit using the integrated compensation term.

* * * * *